United States Patent
Nagai et al.

(10) Patent No.: US 8,256,501 B2
(45) Date of Patent: Sep. 4, 2012

(54) PLATE-TYPE HEAT TRANSPORT DEVICE AND ELECTRONIC INSTRUMENT

(75) Inventors: Hiroyuki Nagai, Chiba (JP); Hiroyuki Ryoson, Kanagawa (JP)

(73) Assignee: Sony Corporation, Tokyo (JP)

( * ) Notice: Subject to any disclaimer, the term of this patent is extended or adjusted under 35 U.S.C. 154(b) by 1335 days.

(21) Appl. No.: 11/685,561

(22) Filed: Mar. 13, 2007

(65) Prior Publication Data

US 2007/0227704 A1    Oct. 4, 2007

(30) Foreign Application Priority Data

Mar. 28, 2006  (JP) .................................. 2006-086871

(51) Int. Cl.
  *F28D 15/00*  (2006.01)
  *H05K 7/20*  (2006.01)
(52) U.S. Cl. .............. 165/80.4; 165/104.21; 165/104.26
(58) Field of Classification Search ................. 165/80.4, 165/80.2, 104.21, 104.26; 361/699, 700; 257/714, 715; 174/15.2
See application file for complete search history.

(56) References Cited

U.S. PATENT DOCUMENTS

| | | | | |
|---|---|---|---|---|
| 3,613,778 A * | 10/1971 | Feldman, Jr. | ............ | 165/104.26 |
| 4,046,190 A * | 9/1977 | Marcus et al. | ............ | 165/104.26 |
| 5,308,920 A * | 5/1994 | Itoh | ................................ | 174/15.2 |
| 5,634,351 A * | 6/1997 | Larson et al. | ................. | 62/259.2 |
| 5,697,428 A * | 12/1997 | Akachi | ..................... | 165/104.21 |
| 6,650,544 B1 * | 11/2003 | Lai | ................................. | 361/700 |
| 6,766,817 B2 | 7/2004 | da Silva | | |
| 6,782,942 B1 * | 8/2004 | Wang et al. | .............. | 165/104.26 |
| 6,918,404 B2 | 7/2005 | da Silva | | |
| 7,011,146 B2 * | 3/2006 | Wong | ........................ | 165/104.33 |
| 7,066,586 B2 | 6/2006 | da Silva | | |
| 7,180,179 B2 * | 2/2007 | Mok et al. | ...................... | 257/714 |
| 2004/0011512 A1 * | 1/2004 | Noda et al. | ................ | 165/104.26 |
| 2004/0069460 A1 * | 4/2004 | Sasaki et al. | ............. | 165/104.26 |
| 2006/0065385 A1 | 3/2006 | Tonosaki et al. | | |

FOREIGN PATENT DOCUMENTS

| | | |
|---|---|---|
| JP | 2004-108760 | 4/2004 |
| JP | 2004108760 | 4/2004 |
| JP | 2004190985 | 7/2004 |
| JP | 2006-190985 | 7/2006 |

* cited by examiner

*Primary Examiner* — Tho V Duong
(74) *Attorney, Agent, or Firm* — K&L Gates LLP

(57) ABSTRACT

A plate-type heat transport device and electronic instrument are provided. The plate-type heat transport device includes a heat absorbing plane absorbing heat because of the evaporation of a working fluid, a heat emission plane opposing the heat absorbing plane and emitting heat because of the condensation of the working fluid, and a flow path two-dimensionally arranged between the heat absorbing plane and the heat emission plane to align with the heat absorbing plane and the heat emission plane, the flow path allowing the working fluid to flow therethrough for changing the phase of the working fluid, and the flow path being capable of two-dimensionally diffusing the working fluid by generating a capillary force in the condensed working fluid.

7 Claims, 15 Drawing Sheets

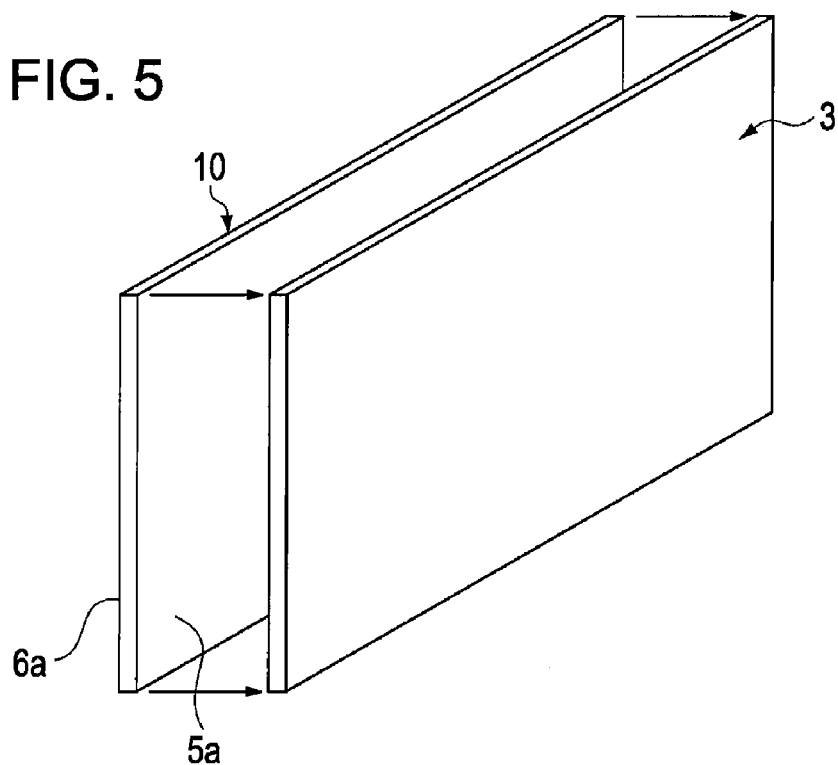
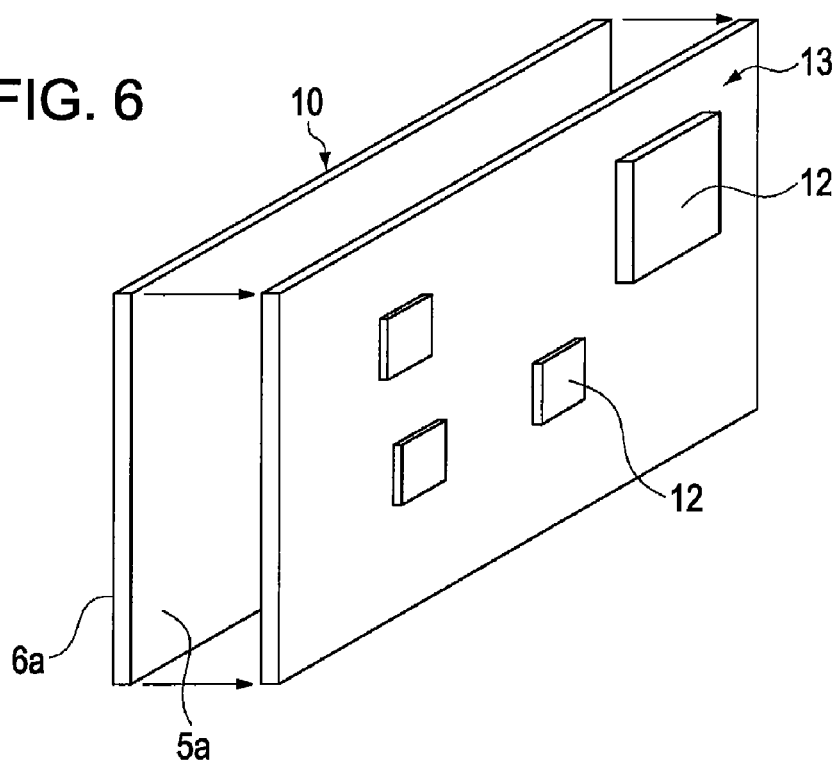

HEAT TRANSPORT DEVICE KIND

|  | Si/G | Al/G | Cu/G | HEAT TRANSPORT DEVICE a (Si/G) | HEAT TRANSPORT DEVICE b (Si/G) | HEAT TRANSPORT DEVICE c (Si/G) |
|---|---|---|---|---|---|---|
| Ave | 66.7 | 66.6 | 65.3 | 63.6 | 60.4 | 59.7 |
| Max | 70.7 | 70.8 | 69.2 | 68.3 | 65.8 | 64.2 |
| Min | 62.6 | 64.2 | 61.7 | 59.8 | 55.7 | 55.6 |
|  | 8.1 | 6.6 | 7.5 | 8.5 | 10.1 | 8.6 |

PLATE-TYPE HEAT TRANSPORT DEVICE AND ELECTRONIC INSTRUMENT

CROSS REFERENCES TO RELATED APPLICATIONS

The present application claims priority to Japanese Patent Application JP 2006-086871 filed in the Japanese Patent Office on Mar. 28, 2006, the entire contents of which are incorporated herein by reference.

BACKGROUND

The present application relates to a plate-type heat transport device for transporting heat by a working fluid driving force produced due to a capillary force using latent heat due to the phase change of the working fluid, and a display having the transport device mounted thereon.

Among heat transport devices using latent heat due to the phase change of the working fluid, a thin heat transport device has been known, which is constructed of a plurality of substrates bonded to each other with grooves for allowing the working fluid to pass therethrough (see Japanese Unexamined Patent Application Publication No. 2004-108760, [0038], FIG. 1, and Japanese Unexamined Patent Application Publication No. 2004-190985, [0020], FIG. 1). In the heat transport device disclosed in Japanese Unexamined Patent Application Publication No. 2004-190985, an evaporator and a condenser of the working fluid as well as a gas path and a fluid path, which allow the evaporator and the condenser to communicate with each other, are formed on the substrates. Also, on each of the substrates, the micro groove is formed for generating a capillary force as a pumping force of the working fluid.

Recently, thin-type television sets using FADS (flat panel displays) have been available, and heat generated from their display panels poses a problem. In a liquid crystal display, for example, if an LED (light emitting diode) back light is used, a large quantity of heat is generated from the entire surface of the display panel. Display panels using a plasma display and an OLED (organic LED) also generate heat in large quantity.

Then, the entire surface of the display panel may be covered with a solid metallic heat-radiating plate. However, since the thermal diffusion of a general heat radiating plate depends on the thermal conductivity of a metal, its responsiveness is a problem. Also, since such a heat radiating plate requires its own rigidity, it disadvantageously has to have a thickness and a weight to some extent. When the display panel becomes larger in size, the panel is difficult to be uniformly cooled so as to generate temperature unevenness on the panel, resulting in unevenness in brightness and color of display images.

On the other hand, when a display panel is cooled using the heat transport device mentioned above, a problem also arises. For example, even if the evaporator of the heat transport device disclosed in Japanese Unexamined Patent Application Publication No. 2004-190985 is attached to a display panel, it is difficult to uniformly cool the display panel over its entire surface. Even when the heat transport device is used, if a heat source is located on the surface of the display panel, especially in its upper portion, the working fluid may not be supplied to the heat source by only the capillary force because of the gravity force applied to the working fluid. This case cannot also anticipate so much the uniform cooling.

SUMMARY

It is desirable to provide a plate-type heat transport device capable of uniformly emitting the two-dimensionally generated heat within over the generating plane and an electronic instrument having the heat transport device mounted thereon.

According to an embodiment, there is provided a plate-type heat transport device including a heat absorbing plane absorbing heat because of the evaporation of a working fluid; a heat emission plane opposing the heat absorbing plane and emitting heat because of the condensation of the working fluid; and a flow path two-dimensionally arranged between the heat absorbing plane and the heat emission plane to align with the heat absorbing plane and the heat emission plane, the flow path allowing the working fluid to flow therethrough for changing the phase of the working fluid, and the flow path being capable of two-dimensionally diffusing the working fluid by generating a capillary force in the condensed working fluid.

According to the embodiment, the working fluid evaporated on the heat absorbing plane side flows through the flow path, which is two-dimensionally arranged between the heat absorbing plane and the heat emission plane to align with the heat absorbing plane and the heat emission plane, so that the phase of the working fluid is changed to emit heat from the heat emission plane. The working fluid condensed due to the heat emission is returned toward the heat absorbing plane by a capillary force while two-dimensionally expanding in the vicinity of the heat absorbing plane. Thereby, the two-dimensionally generated heat can be uniformly absorbed from the entire heat absorbing plane and the heat can be uniformly emitted from the entire heat emission plane, so that the two-dimensionally generated heat can be reduced uniformly in temperature.

According to the embodiment, a capillary force can be generated by the entire two-dimensional flow path. Hence, even when the plate-type heat transport device is directed so that the heat absorbing plane or the heat emission plane is arranged in parallel with the direction of the gravity force, for example (referred below to as a perpendicular position), the liquid-phase working fluid can be two-dimensionally diffused. That is, regardless of the position of the plate-type heat transport device, the working fluid can be returned toward the heat absorbing plane.

In an embodiment, the flow path includes a plurality of first regions two-dimensionally arranged at a position adjacent to the heat absorbing plane, each being a straight shape arranged in parallel with each other, and a plurality of second regions two-dimensionally arranged at a position adjacent to the heat emission plane to oppose the heat absorbing plane, each being a straight shape arranged in parallel with each other to be orthogonal to each of the first regions. According to the embodiment, the term "parallel" means substantial parallel excluding a case where a non-parallel structure is affirmatively designed. This is the same below.

In an embodiment, each of the first regions has a first width while each of the second regions has a second width larger than the first width. Thereby, the capillary force capable of returning the liquid-phase working fluid toward the heat absorbing plane can be securely produced.

In an embodiment, the flow path is two-dimensionally scattered between the first regions and the second regions, and includes a plurality of communication paths for allowing communicating between the first regions and the second regions. Thereby, the thermal insulating effect can be increased between the first regions and the second regions so as to facilitate the phase change of the working fluid.

In an embodiment, at least one of the communication paths is formed to gradually expand toward the second regions from the first regions. That is, according to the embodiment, the flow path is configured so as to gradually reduce the flow path resistance toward the second regions from the first regions. Thereby, the working fluid evaporated in the first regions to have a larger volume is facilitated to flow toward the second regions. The term "gradually" means continuously, stepwise, or their combination.

In an embodiment, the flow path includes a plurality of grooves two-dimensionally arranged at a position adjacent to the heat absorbing plane and a concave region arranged at a position adjacent to the heat emission plane to oppose the grooves. Thereby, the gaseous-phase working fluid is liable to expand in the concave region, promoting the condensation. The plurality of the grooves formed on the first plate enable the capillary force to be generated.

In an embodiment, the flow path includes a plurality of communication paths two-dimensionally scattered between the grooves and the concave region for allowing communicating between a predetermined groove of the grooves and the concave region.

In an embodiment, the plate-type heat transport device further includes a plurality of ribs for dividing the concave region into a plurality of parts, and each of the ribs includes a slit allowing communicating one part of the concave region with the adjacent part. The heat transport device according to the embodiment is effective when it is used in a vertical posture. That is, in this case, the evaporated gaseous phase working fluid is assumed to also move upwardly; thus, the gaseous phase working fluid can be prevented from being upward deviated in the concave region, contributing to the uniform cooling. Also, by providing slits, the pressure of the entire concave region can be equalized.

In an embodiment, the flow path includes a recess group composed of a plurality of recesses that are two-dimensionally scattered and a projection group composed of a plurality of projections that are two-dimensionally scattered to oppose the recess group.

In an embodiment, the recesses oppose the projections, respectively, to be relatively displaced from each other. Thereby, when the recess and the projection are regularly arranged, two-dimensionally formed flow paths formed of the recesses and the projections (spaces) can be communicated with each other over the entire plane. In this case, the length of the recess may be the same as that of the projection or may be different therefrom. Furthermore, according to the embodiment, even if the recess and the projection are not positively displaced from each other in position, they are consequently displaced, so that the entire flow paths can be communicated with each other over the entire plane. Hence, in a process manufacturing the heat transport device by bonding the first plate with the recesses on the second plate with the projections, the relative positional accuracies between the first and second plates may be rather low during the bonding process, facilitating the manufacturing.

In an embodiment, the recesses, each having a first length, are lengthwise and crosswise arranged while the projections are arranged to align at a slant, and each of the projections has a second length longer than the first length so that at least two recesses of the recesses oppose one of the projections. Thereby, two-dimensionally formed flow paths formed of the recesses and the projections (spaces) can be communicated with each other over the entire plane. In this case, the length of the recess may be the same as that of the projection or may be different therefrom.

In an embodiment, the projections, each having a first length, are lengthwise and crosswise arranged while the recesses are arranged to align at a slant, and each of the recesses has a second length longer than the first length so that at least two projections of the projections oppose one of the recesses.

In an embodiment, the flow path includes a recess group composed of a plurality of recesses that are two-dimensionally scattered a projection group composed of a plurality of projections that are two-dimensionally scattered to oppose the recess group, a concave region two-dimensionally arranged at a position adjacent to the heat emission plane to align with the heat absorbing plane and the heat emission plane, and a plurality of communication paths for allowing communicating between the recess group and the concave region. Thereby, the flow path has a thermal insulating function, and furthermore, the working fluid is increased in volume in the concave region, so the working fluid can be facilitated to change its phase.

In an embodiment, at least one of the communication paths is formed to gradually expand toward the concave region from the recess group. Thereby, the working fluid evaporated mainly in the recesses is liable to expand toward the concave region.

In an embodiment, the plate-type heat transport device according to the embodiment further includes a clad material joined to at least one of the heat absorbing plane and the heat emission plane. Thereby, by appropriately selecting a plurality of materials constituting the clad material, the heat absorbing efficiency in the heat absorbing plane or the heat emitting efficiency in the heat emission plane can be improved.

According to another embodiment, there is provided a plate-type heat transport device including a first plate having a heat absorbing plane absorbing heat because of the evaporation of a working fluid; a second plate arranged to oppose the first plate and having a heat emission plane opposing the heat absorbing plane and emitting heat because of the condensation of the working fluid; a flow path two-dimensionally arranged between the heat absorbing plane and the heat emission plane to align with the heat absorbing plane and the heat emission plane, the flow path allowing the working fluid to flow therethrough for changing the phase of the working fluid, and the flow path being capable of two-dimensionally diffusing the working fluid by generating a capillary force in the condensed working fluid.

According to this embodiment, the working fluid evaporated on the heat absorbing plane side flows through the flow path, which is two-dimensionally arranged between the heat absorbing plane and the heat emission plane, so that the phase of the working fluid is changed to emit heat from the heat emission plane. The working fluid condensed due to the heat emission is returned toward the heat absorbing plane by a capillary force while two-dimensionally expanding in the vicinity of the heat absorbing plane. Thereby, the two-dimensionally generated heat can be uniformly absorbed from the entire heat absorbing plane and the heat can be uniformly emitted from the entire heat emission plane, so that the two-dimensionally generated heat can be reduced uniformly in temperature.

An electronic instrument according to another embodiment includes a heat source two-dimensionally generating heat and a plate-type heat transport device, and the plate-type heat transport device includes a heat absorbing plane thermally connected to the heat source and absorbing heat because of the evaporation of a working fluid; a heat emission plane opposing the heat absorbing plane and emitting heat because of the condensation of the working fluid; and a flow path two-dimensionally arranged between the heat absorbing plane and the heat emission plane to align with the heat absorbing plane and the heat emission plane, the flow path allowing the working fluid to flow therethrough for changing the phase of the working fluid, and the flow path being capable of two-dimensionally diffusing the working fluid by generating a capillary force in the condensed working fluid.

The term "thermally connected" means directly connected or connected via a thermal conductive material.

The term "two-dimensionally generated heat" includes a situation where heat is generated from the entire one plane and a situation where heat is generated from two-dimensionally scattered heating bodies.

As described above, according to the embodiments, the two-dimensionally generated heat can be uniformly emitted within its generating plane.

Additional features and advantages are described herein, and will be apparent from, the following Detailed Description and the figures.

BRIEF DESCRIPTION OF THE FIGURES

FIG. 5 is a perspective view of the heat transport device being attached in contact with a display panel as a heat source.

FIG. 6 is a perspective view for illustrating when a circuit board built in an electronic instrument is a heat source.

DETAILED DESCRIPTION

Embodiments will be described below with reference to the drawings.

Figure 1:
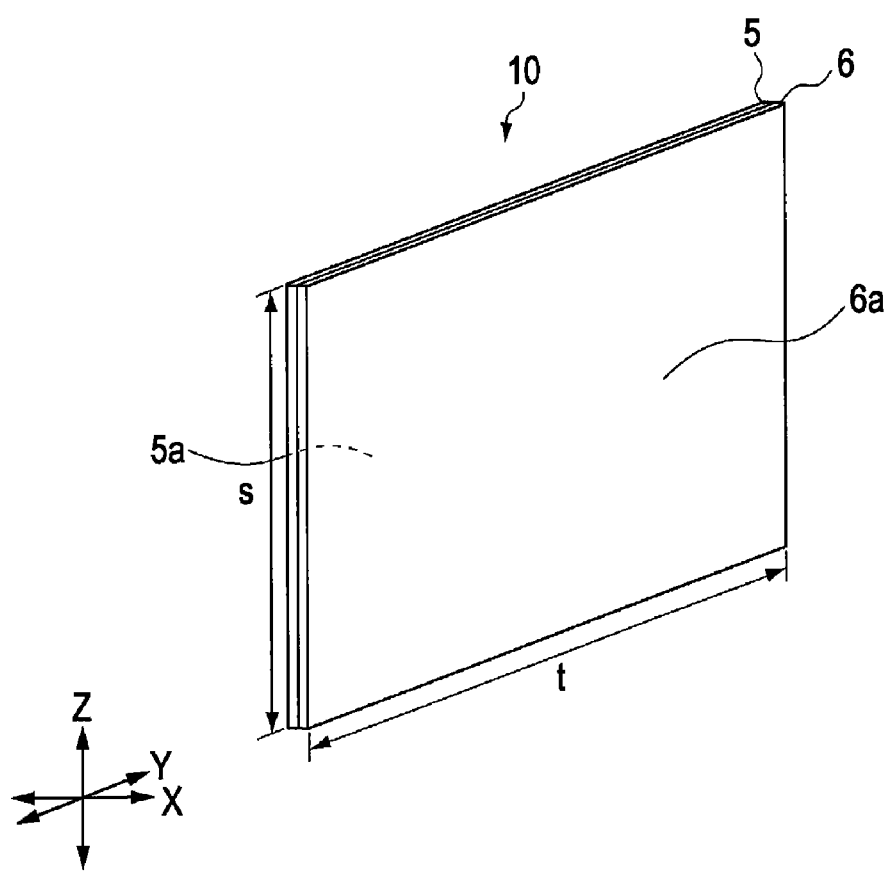
FIG. 1 is a perspective view of a heat transport device according to an embodiment.
Figure 2:
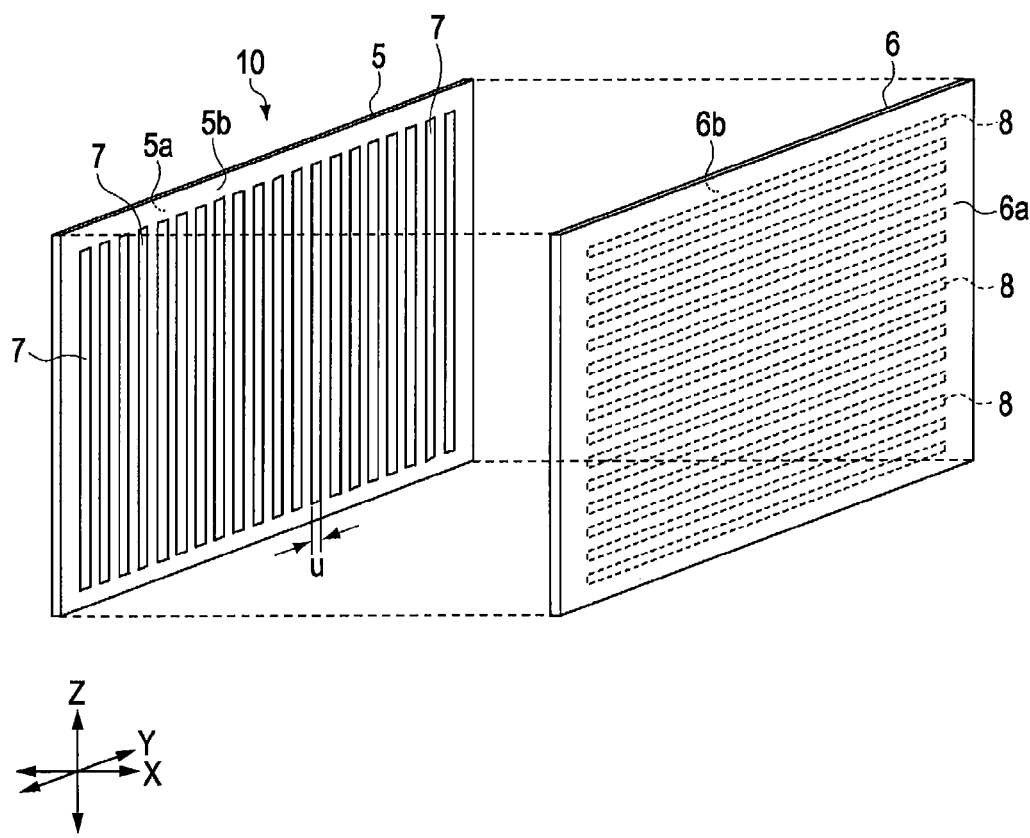
FIG. 2 is an exploded perspective view of the heat transport device shown in FIG. 1.
Figure 3:
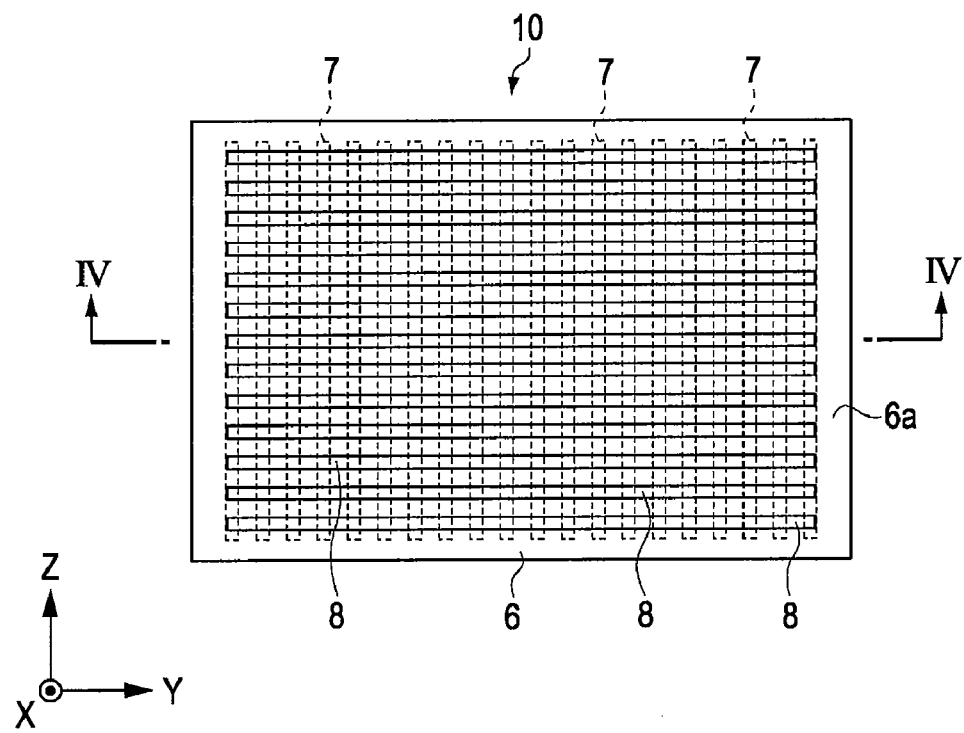
FIG. 3 is a plan view of the heat transport device shown in FIG. 1.
Figure 4:
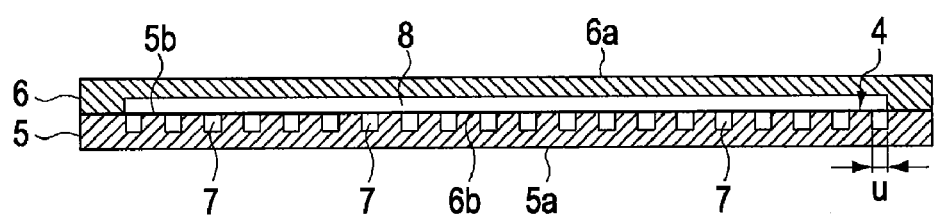
FIG. 4 is a sectional view at the line A-A of FIG. 3.

FIG. 1 is a perspective view of a plate-type heat transport device (simply referred to as a heat transfer device below) according to an embodiment; FIG. 2 is an exploded perspective view of the heat transport device shown in FIG. 1; FIG. 3 is a plan view of the heat transport device; and FIG. 4 is a sectional view at the line A-A of FIG. 3.

A heat transport device 10 is constructed of a first plate 5 and a second plate 6 bonded on the first plate 5. The first plate 5 includes a heat absorbing plane 5a, on which a heating source (not shown) is thermally connected, and a bonding plane 5b, on which the second plate 6 is bonded. The second plate 6 includes a heat emission plane 6a opposing the heat absorbing plane 5a and a bonding plane 6b, on which the first plate 5 is bonded. Between the first plate 5 and the second plate 6, as shown in FIG. 4, flow paths 4 are provided for allowing a working fluid as a refrigerant to flow therethrough. The flow paths 4 are enclosed under vacuum pressure. The working fluid includes pure water, ethanol, methanol, acetone, isopropyl alcohol, CFCs substitute, and ammonia; however, it is not limited to these.

The heat absorbing plane 5a occupies almost entire one external surface of the first plate 5, so that the almost entire surface of the first plate 5 can absorb heat, as will be described later. The heat emission plane 6a of the second plate 6 also occupies almost entire one external surface of the first plate 6 in the same way as the heat absorbing plane 5a of the first plate 5.

The bonding plane 5b of the first plate 5 is provided with a plurality of linear grooves (first region) 7 formed thereon in parallel with each other for constituting the flow paths 4. The bonding plane 6b of the second plate 6 is also provided with a plurality of linear grooves (second region) 8 formed thereon for constituting the flow paths 4, in the same way. The grooves 8 of the second plate 6 are arranged in parallel with each other in a longitudinal direction (y direction) perpendicular to that (z direction) of the grooves 7 of the first plate 5.

The width of the groove 7 of the first plate 5 (or the groove 8 of the second plate 6), i.e. The length u shown in FIGS. 1 and 4, is in a range from several tens μm to several hundreds μm. Specifically, the width ranges from 10 μm to 200 μm; however, the width is not limited to this range. The depth of the groove 7 (or the groove 8) ranges several μm to several tens μm. Specifically, the depth ranges from 10 μm to 20 μm; however, the depth is not limited to this range. In FIGS. 1 to 4, the grooves 7 and the grooves 8 are schematically shown, so that in practice, these are more microscopic grooves. The sizes of the first plate 5 and the second plate 6 are substantially the same; however, the first plate 5 may be somewhat different in size from the second plate 6 as long as they can be bonded on each other so as to seal the flow paths 4. The width of the first plate 5 may be the same as that of the second plate 6. When the widths are the same, a capillary force is uniformly exerted on the working fluid in the whole flow paths 4, so that the working fluid is held in a liquid phase within the whole flow paths 4.

When the width of the groove 8 of the second plate 6 is larger than that of the groove 7 of the first plate 5, the capillary force generated in the working fluid containing in the grooves 7 of the first plate 5 is larger than that containing in the grooves 8 of the first plate 6, so that the working fluid is held in a liquid phase mainly within the grooves 7.

The grooves 7 and the grooves 8 are formed by photolithographic or blast etching; alternatively, they may be constructed by bonding thin plates together or by a lift-up process (plating, CVD (chemical vapor deposition), or vapor deposition). The first plate 5 is joined to the second plate 6 by laser beam welding or electron beam welding; alternatively, it may be joined thereto by diffusion joining, anode coupling, heat bonding, gluing, and hard soldering.

The vertical length s of the first plate 5 or the second plate 6 ranges from several tens mm to several hundreds mm, or it may be over 1000 mm. This size may be appropriately established. As will be described later, when the plates are attached to a display panel to be mounted on a display, the sizes may be appropriately established corresponding to those of the display panel. The lateral length t is established corresponding to that of the display panel, and the ratio may be s:t=3:4 or 9:16, for example. However, the ratio is obviously not limited to these.

The first plate 5 uses a metal, a semiconductor, or a resin, for example. The metal may include stainless steel, aluminum, and upper, for example; the semiconductor may include silicon; and the resin includes glass and plastics and also a resin with good thermal conductivity such as carbon. However, the material is not limited to these and may be appropriately replaced. The second plate 6 also uses a material similar to that of the first plate 5. Both the first plate 5 and the second plate 6 may use the same metal or different metals, respectively. For example, silicon or a metal is used by the first plate 5 while glass is used by the second plate 6. However, the combination is not limited to these and various combinations may be employed.

FIG. 5 is a perspective view of the heat transport device 10 being attached in contact with the display panel as a heat source. Specifically, the display panel 3 opposes the heat absorbing plane 5a of the first plate 5 constituting the heat transport device 10 to be thermally connected thereto.

The display panel 3 herein includes a liquid crystal display, an EL (electro-luminescence) display (either organic or inorganic), an LED display (either organic or inorganic), a plasma display, a plasma address liquid crystal display, and a field-emission display, for example. The field-emission display is a display such as an FED (field emission display) and a USED (surface-conduction electron-emitter display. In the case of the liquid crystal display, the display panel 3 includes a back light, especially an LED back light, so that the LED back light serves as a heat source. In the LED back light, a plurality of LEADS are two-dimensionally arranged.

The operation of the heat transport device 10 configured as above will be described. The heat generated from the display panel 3 is two-dimensionally conducted onto the first plate 5 via the heat absorbing plane 5a. Thereby, the working fluid held at least to the grooves 7 of the first plate 5 due to the capillary force is evaporated. The evaporated gaseous-phase working fluid is moved through the flow paths 4 so as to two-dimensionally emit heat via the heat emission plane 6a. Sometimes, a heat sink (not shown) may be thermally connected to the heat emission plane 6a or air may be blown onto the heat emission plane 6a by a fan, thereby promoting the heat emission. Instead of the fan, a Peltier element may also be used. When the heat is emitted from the heat emission plane 6a, the working fluid is condensed.

In such a manner, the working fluid evaporated on the heat absorbing plane 5a side flows through flow paths two-dimensionally provided between the heat absorbing plane 5a and the heat emission plane 6a in parallel therewith, so that heat is transported due to the phase change of the working fluid. Much of the liquid-phase working fluid is corrected at least toward the first plate 5 at least due to the capillary force of the grooves 7. Since the grooves 7 are two-dimensionally arranged on the first plate 5, the liquid-phase working fluid uniformly diffuses at least through the first plate 5.

The working fluid is circulated by repeating such operation, so that the display panel 3 is cooled. In the heat transport device 10 especially according to the embodiment, the heat two-dimensionally generated from the display panel 3 can be uniformly absorbed through the entire heat absorbing plane 5a, and can be uniformly emitted from the entire heat emission plane 6a. Thereby, the two-dimensionally generated heat can be reduced uniformly in temperature.

According to the embodiment, in the entire grooves 7 and 8 two-dimensionally arranged as described above, a capillary force can be generated. Hence, even when the heat transport device 10 is directed so that the heat absorbing plane 5a or the heat emission plane 6a is arranged in parallel with the direction of the gravity force, i.e., perpendicular to the ground, the liquid-phase working fluid can be two-dimensionally diffused. That is, regardless of the position of the heat transport device 10, the working fluid can be returned toward the grooves 7 of the first plate 5. According to experiments, when the heat transport device 10 was vertically positioned, the working fluid was raised against the gravity force higher than one m, specifically by 1.8 m.

Even when the heat received from a heat source is excessive, resulting in overheating, so-called as dry-out, if the heat from the heat source is eliminated thereafter, the working fluid can be self-returned by the capillary force regardless of the position of the heat transport device 10.

According to the embodiment, a heat transport device extremely reduced in thickness and weight can be achieved.

Depending on the amount of the working fluid contained in the heat transport device 10, during non-operation of the heat transport device, i.e., when the thermal load is not applied thereto, the working fluid may exist not only within the grooves 7 of the first plate 5 but also within the grooves 8 of the second plate 6. According to the heat of the heat source, the amount and the kind of the working fluid are appropriately established.

FIG. 6 is a perspective view for illustrating when a circuit board 13 built in an electronic instrument is a heat source. On the circuit board 13, exothermic bodies 12, such as a CPU (central processing unit) and a heat source, are mounted. The heat is conducted to the circuit board 13 from the exothermic bodies 12. To the heat absorbing plane 5a of the heat transport device 10, the circuit board 13 is thermally connected, so that the circuit board 13 and the exothermic bodies 12 mounted thereon can be cooled.

Figure 7:
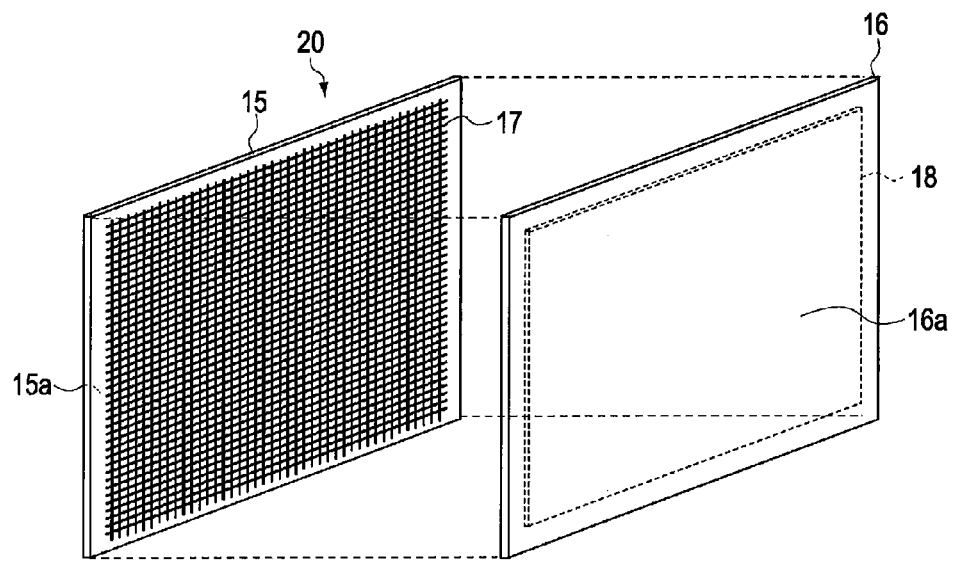
FIG. 7 is an exploded perspective view of a heat transport device according to another embodiment.
Figure 8:
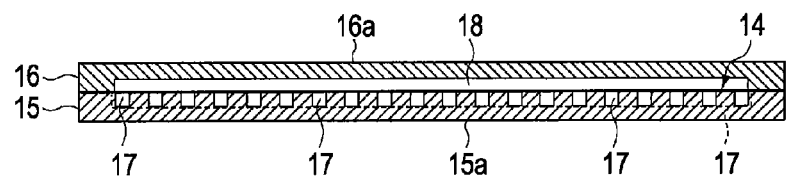
FIG. 8 is a sectional view of the heat transport device shown in FIG. 7.

FIG. 7 is an exploded perspective view of a heat transport device according to another embodiment; FIG. 8 is a sectional view of the heat transport device shown in FIG. 7. In the description below, the same components and functions as those of the heat transport device 10 according to the embodiment shown in FIG. 1 are simplified or omitted, and different points will be mainly described.

A first plate 15 with a heat absorbing plane 15a of a heat transport device 20 is lengthwise and crosswise provided with a plurality of grooves 17 constituting flow paths 14. On the other hand, a second plate 16 with a heat emission plane 16a is provided with a concave region 18 opposing the plurality of lengthwise and crosswise grooves 17. Within the grooves 17, the working fluid is evaporated due to a heat source (not shown), and the heat of the working fluid is depleted in the concave region 18 so that the evaporated working fluid is condensed. The grooves 17 generate a capillary force so as to diffuse the working fluid within the grooves 17. Since the grooves 17 are lengthwise and crosswise formed according to the embodiment, the working fluid is liable to uniformly spread two-dimensionally in comparison with in the grooves 7 of the first plate 5 in the heat transport device 10. The gaseous-phase working fluid is also liable to spread within the concave region 18, promoting the condensation.

In FIG. 7, the lengthwise and crosswise grooves 17 are depicted finely in comparison with the grooves 7 shown in FIG. 2; FIG. 7 is also schematic so that the width of the grooves 17 may be similar to that of the grooves 7 or the grooves 8 or may be different therefrom.

Figure 9:
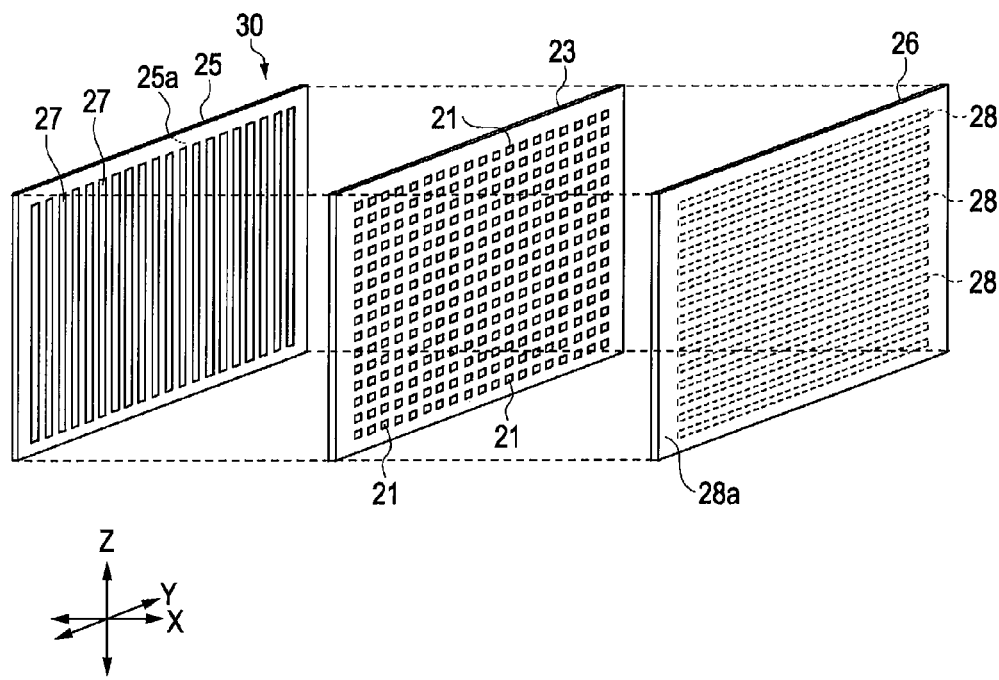
FIG. 9 is an exploded perspective view of a heat transport device according to still another embodiment.
Figure 10:
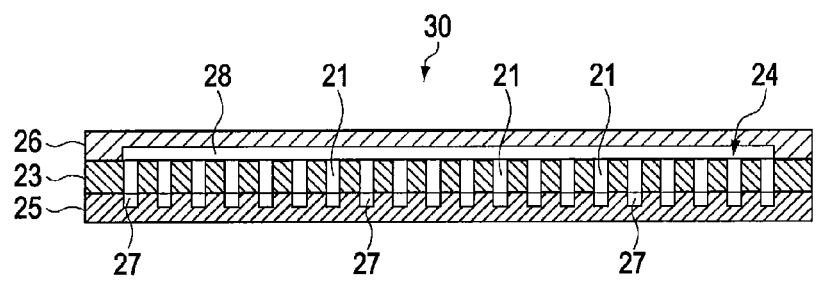
FIG. 10 is a sectional view of the heat transport device shown in FIG. 9.

FIG. 9 is an exploded perspective view of a heat transport device according to still another embodiment; FIG. 10 is a sectional view of the heat transport device shown in FIG. 9.

In the heat transport device 30, a third plate 23 is arranged between a first plate 25 and a second plate 26, and the three plates 25, 26, and 23 are bonded together to configure the heat transport device 30. The third plate 23 is provided with a plurality of holes 21 formed thereon for penetrating through from the first plate 25 to the second plate 26. Grooves 27 of the first plate 25 are communicated with grooves 28 of the second plate 26 through these holes (communication paths), and the grooves 27, the grooves 28, and the communication paths 21 constitute flow paths 24. The third plate 23 may use the same materials as those of the first and second plates 5 and 6 mentioned above, i.e., a metal, a resin, and a semiconductor. Alternatively, the third plate 23 may use materials with lower thermal conductivity than those of the first and second plates 25 and 26.

In the heat transport device 30 structured in such a manner, the working fluid, evaporated in the grooves 27 due to the heat from a heat source arranged in contact with a heat absorbing plane 25a, flows into the grooves 28 via the communication paths 21 of the third plate 23 to be condensed by emitting the heat through a heat emission plane 26a. Since the insulation effectiveness between the first plate 25 and the second plate 26 can be improved by providing the communication paths 21, the working fluid is liable to change in phase, improving the heat transporting efficiency. The insulation effectiveness may be further improved especially when the third plate 23 uses materials with the low thermal conductivity such as glass and a resin.

Figure 11:
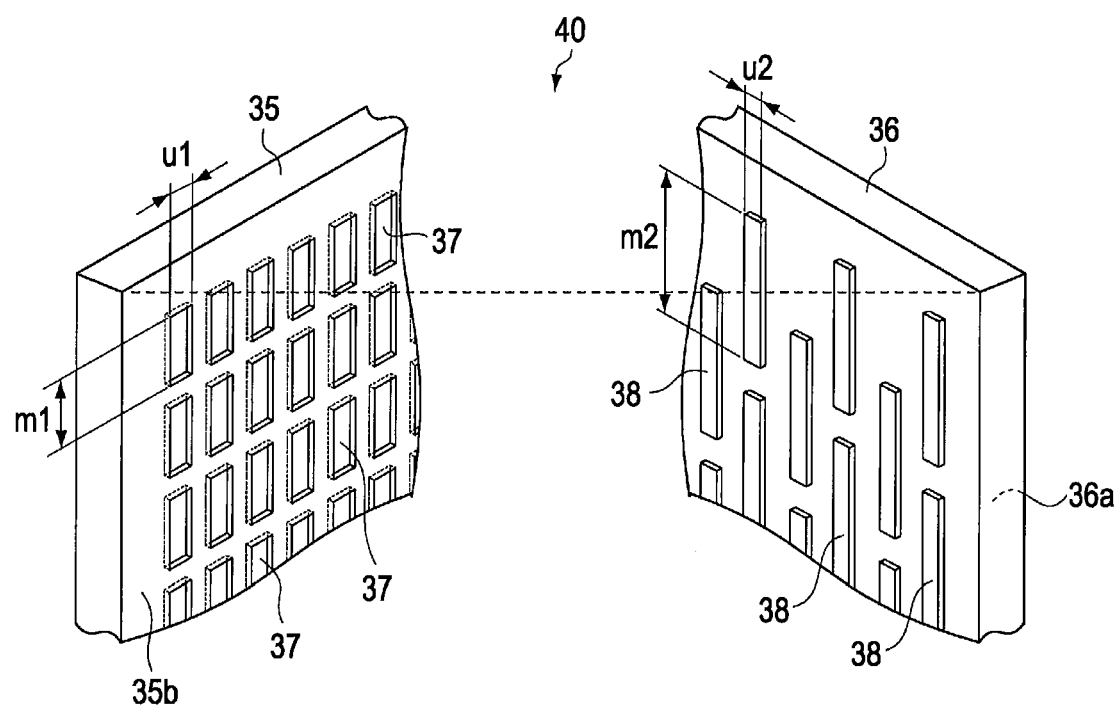
FIG. 11 is an exploded perspective view showing enlarged part of a heat transport device according to still another embodiment.

FIG. 11 is an exploded perspective view showing enlarged part of a heat transport device according to still another embodiment.

In the heat transport device 40 according to the embodiment, a first plate 35 with a heat absorbing plane 35a includes a plurality of recesses 37 formed on its bonding plane, the recesses scattering two-dimensionally thereon. The width u1 and the depth of the recess 37 can be appropriately established, and they may be the same as those of the grooves 7 and 8 shown in FIG. 1. The length m1 of the recess 37 can also be appropriately established, and the shape of the recess 37 is rectangular, i.e., m1>u1. The recesses 37 are arranged to lengthwise and crosswise align, that is, in z- and y-directions, for example.

Figure 12:
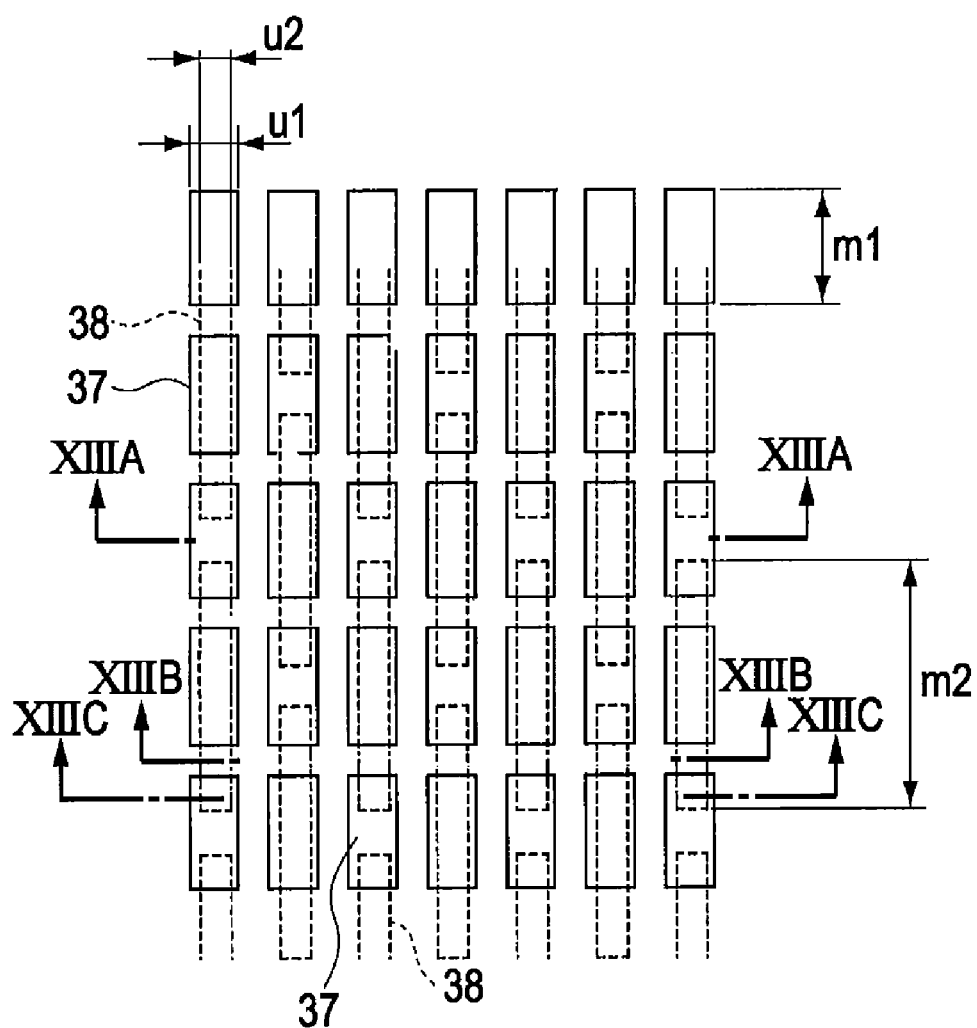
FIG. 12 is a plan view showing the positional relationship between the recesses and the projections of the heat transport device shown in FIG. 11.
Figure 13A:
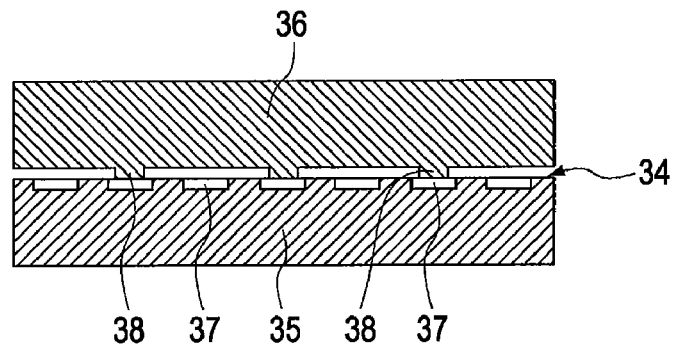
FIGS. 13A to 13C are sectional views at the lines A-A, B-B, and C-C of FIG. 12, respectively.
Figure 13B:
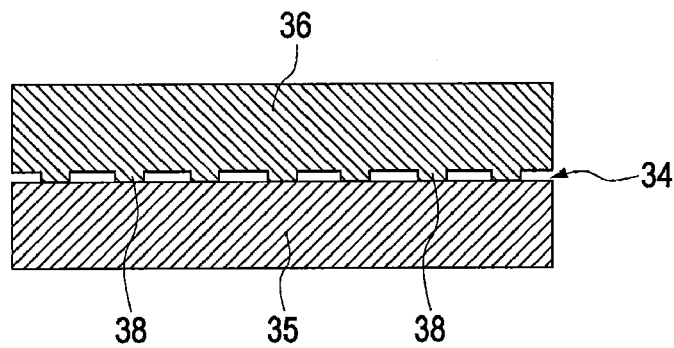
Figure 13C:
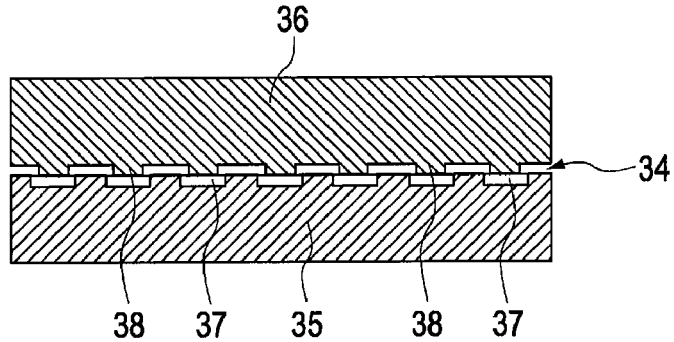

On the other hand, a second plate 36 includes a plurality of block projections 38 two-dimensionally scattered on its bonding plane with the first plate 35. FIG. 12 is a plan view showing the positional relationship between the recesses 37 and the projections 38. FIGS. 13A to 13C are sectional views at the lines A-A, B-B, and C-C of FIG. 12, respectively. Unlike the recess 37 arranged to align lengthwise and crosswise, the projections 38 are staggered to align at a slant, so that each recess 37 opposes each projection 38 to be relatively displaced from each other. The width u2 of the projection 38 is established to be u1>u2, for example; however, it may also be established to be u1=u2 or u1<u2.

The recess 37 and the projection 38 are arranged to oppose each other as well as to be relatively displaced from each other in such a manner, so that two-dimensionally formed flow paths (spaces) 34 can be communicated with each other over the entire plane. In other words, even if the recess 37 and the projection 38 are not positively displaced from each other in position, they are consequently displaced, so that the flow paths 24 can be communicated with each other over the entire plane. Hence, in a process manufacturing the heat transport device 40 by bonding the first plate 35 with the recesses 37 on the second plate 36 with the projections 38, the relative positional accuracies between the first and second plates 35 and 36 may be rather low during the bonding process, facilitating the manufacturing.

Figure 14:
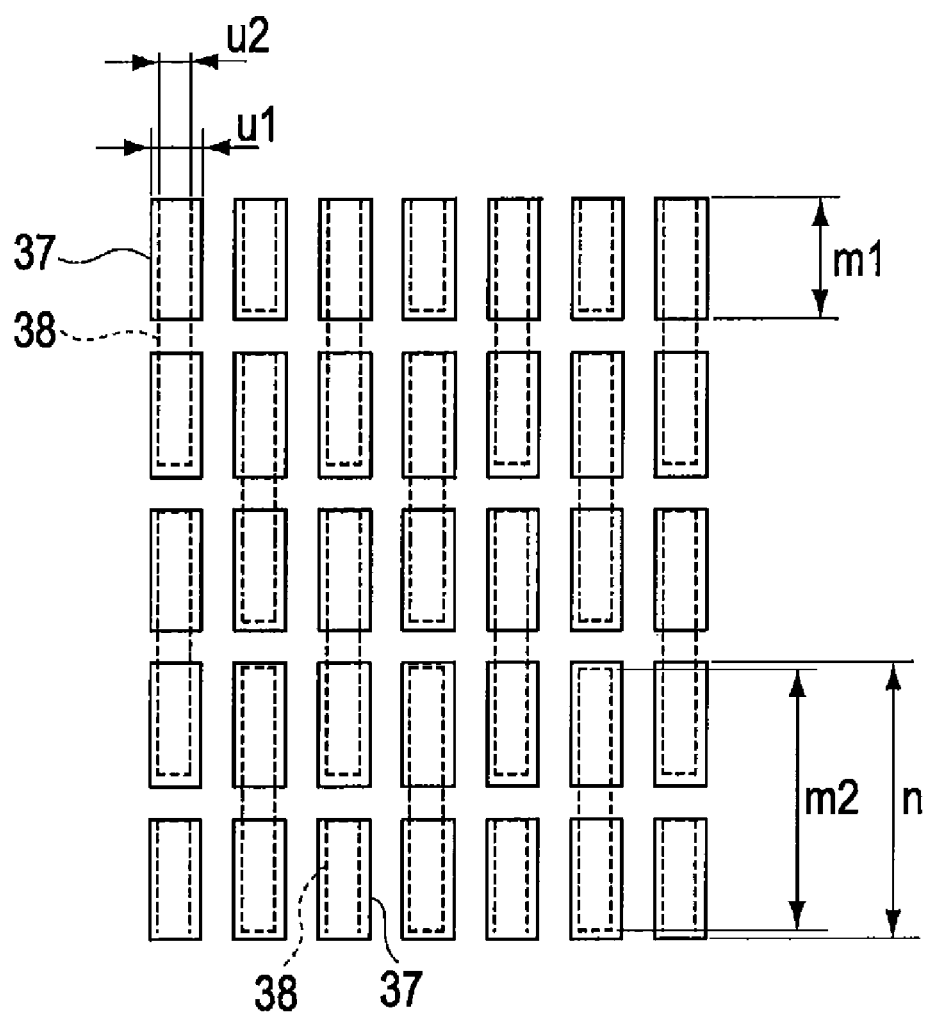
FIG. 14 is a drawing showing the positional relationship between the recesses and the projections of the heat transport device when a first plate is bonded on a second plate by relatively displacing them from each other in comparison with the case of FIG. 12.

The length m2 of the projection 38 is to be m1<m2. Specifically, at least two of the recesses 37 face one of the projections 38. Thereby, in the same way as mentioned above, the two-dimensionally formed flow paths (spaces) 34 can be communicated with each other over the entire plane. However, in this case, if the first plate 35 is bonded on the second plate 36 to be relatively displaced from each other unlike in FIG. 12, the width u1 is required to be different from the width u2, as shown in FIG. 14, for the flow paths 34 can be communicated with each other over the plane. Alternatively, even if u1=u2, when numeral n denotes the distance between the end of one recess 37 and the opposite end of adjacent recess in the lengthwise direction, if m2 is different from n, the flow paths 34 can be communicated with each other over the plane.

In addition, the projections 38 may also be formed on the first plate 35 while the recesses 37 are formed on the second plate 36. The length ms of the recess 37 may also be longer than the length m2 of the projection 38. Alternatively, they may be m1=m2. In this case, it is necessary to design the arranging angle of the projections 38, such that the projections 38 are relatively displaced from the recesses 37, or to bond the first plate 35 on the second plate 36 during their bonding process, such that the projections 38 are relatively displaced from the recesses 37.

Figures 15A, 15B:
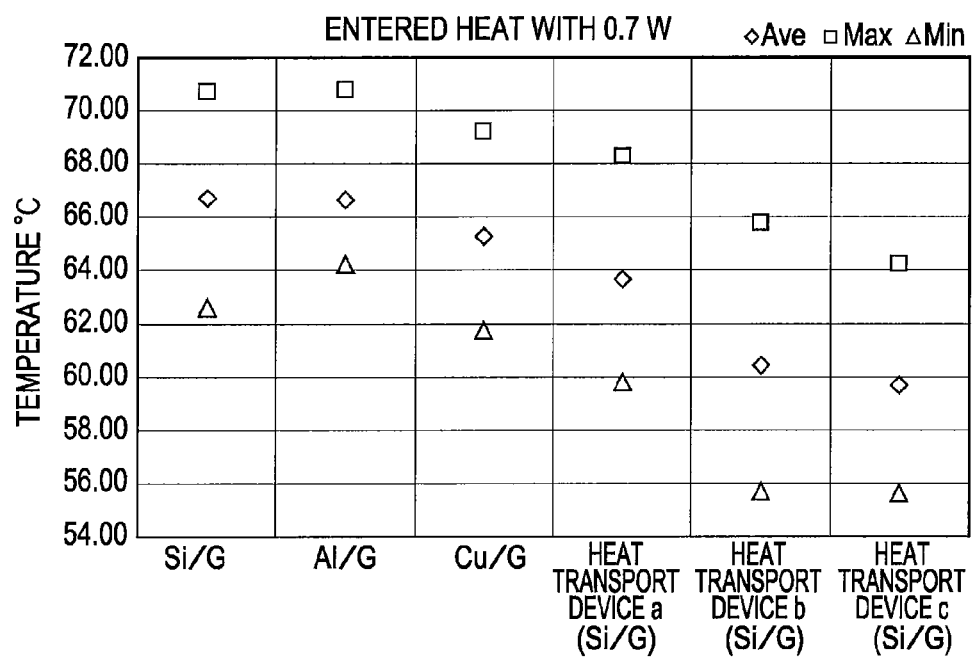
FIG. 15A is a graph showing temperature changes in the vicinity of a heat source when a plurality of heat transport devices are prepared and heat with 7 watts is entered into each of the heat transport devices.
FIG. 15B is a table equivalent to the above-graph.

FIG. 15A is a graph showing temperature changes in the vicinity of the heat source when a plurality of heat transport devices are prepared and heat with 7 watts is entered into each of the heat transport devices. FIG. 15B is a table equivalent to the above-graph. Characters "Si/G" represents a heat emission solid plate constructed by bonding a silicon plate on a glass plate. Characters "Al/G" represents a heat emission solid plate constructed by bonding an aluminum plate on the glass plate. Characters "Cu/G" represents a heat emission solid plate constructed by bonding a copper plate on the glass plate.

A heat transport device "a" represents the case where ethanol is used as a working fluid for the heat transport device 40 shown in FIG. 11. Both the heat transport devices "a" and "b" denote cases where the first plate uses silicon and the second plate uses glass. Both the heat transport devices "b" and "c" denote cases where the experiment is again performed using pure water for the heat transport device 40. Also in the heat transport devices "b" and "c", the first plate 35 uses silicon and the second plate 36 uses glass. In the heat transport devices "a", "b", and "c", it is understood that the temperature of the heat source could be reduced in comparison with the conventional solid heat-emission plate. Since the working temperature of ethanol is different from that of pure water, the experimental results are also different; a refrigerant may be selected in accordance with the thermal capacity of the heat source.

Figure 16:
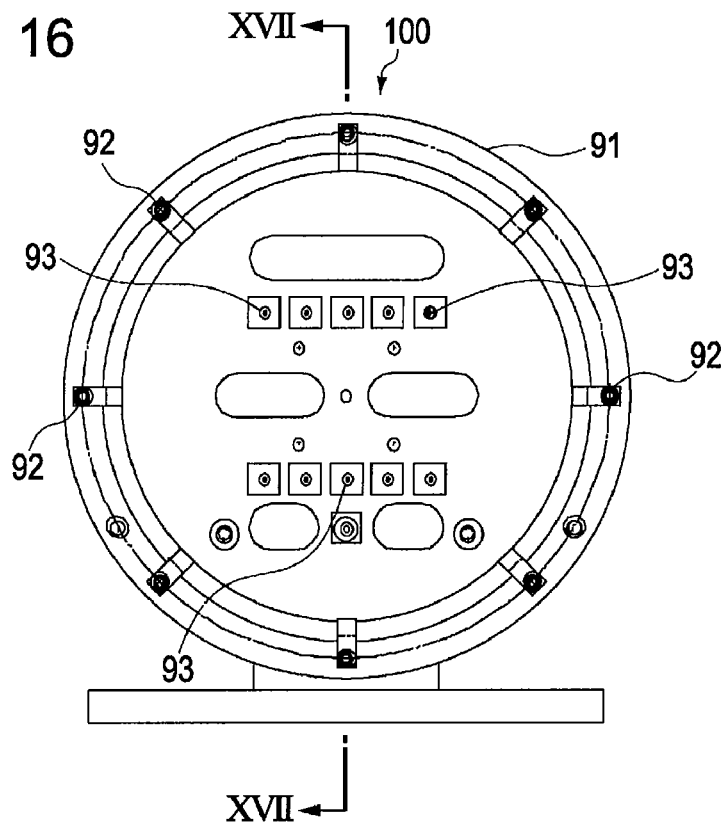
FIG. 16 is a front view of the two-dimensional heat source device used for experiments.
Figure 17:
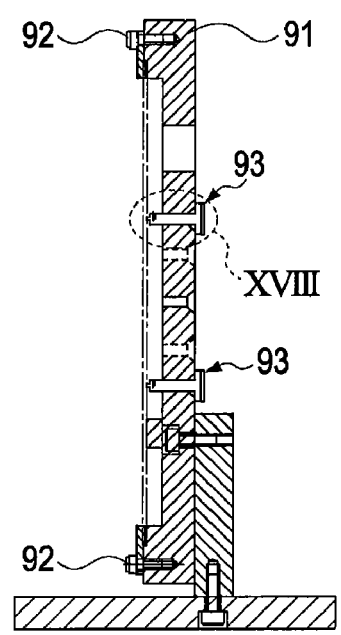
FIG. 17 is a sectional view at the line D-D of FIG. 16.
Figure 18:
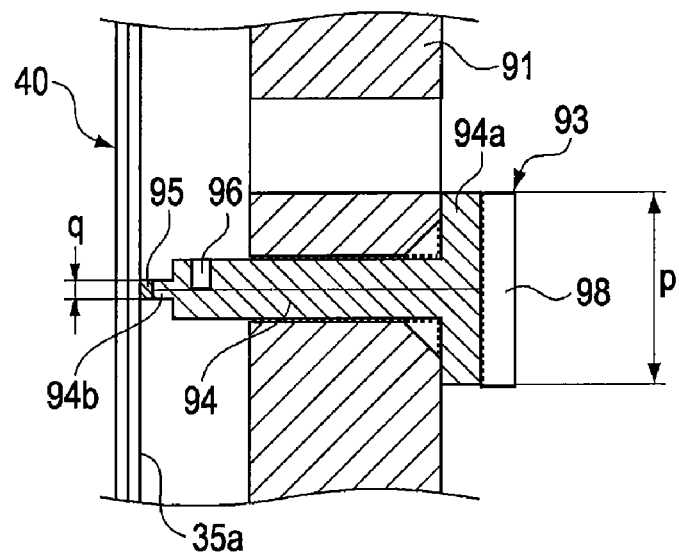
FIG. 18 is an enlarged view of the portion surrounded by the broken line of FIG. 17.

FIG. 16 is a front view of a heat source device used for these experiments; FIG. 17 is a sectional view at the line D-D of FIG. 16. The heat source device 100 includes a disk-shaped base plate 91 made of a peak material and a plurality of thermal point sources 93 two-dimensionally attached on the base plate 91. Five of the thermal point sources 93 are attached at an upper portion of the base plate 91 and five at a lower portion, ten in total, for example. FIG. 18 is an enlarged view of a portion surrounded by the broken line H of FIG. 17. Specifically, as shown in FIG. 18, the thermal point source 93 includes a copper plug 94, a head 94a with 10 mm diameter of the copper plug 94, and a ceramic heater 98 connected on the head 94a and having 10 mm diameter P. A thermal conduction sheet 95 or grease is attached at the end portion 94b of the copper plug 94. The experiments were performed when the end portion 94b was in touch with the heat absorbing plane 35a of the heat transport device 40 and so forth with the thermal conduction sheet 95 therebetween.

The heat source device 100 may be fixed with screws 92. In the vicinity of the end portion 94b of the copper plug 94, a temperature sensor 96 using a thermocouple is embedded to measure the temperature. Characters "Max" denote the maximum temperature among temperatures detected by the temperature sensors 96 embedded in the 10 copper plugs 94, respectively. Characters "Min" the minimum temperature; characters "Ave" the average value.

The diameter "q" of the end portion of the copper plug 94 is 1 mm. This dimension is substantially equivalent to the heat emission region heated by one LED element used for an LED back light of a liquid crystal display panel. That is, the heat source device 100 assumes part of the LED back light. The practical LED back light uses several hundreds to several thousands LEADS; it depends on the size of the display.

Figure 19:
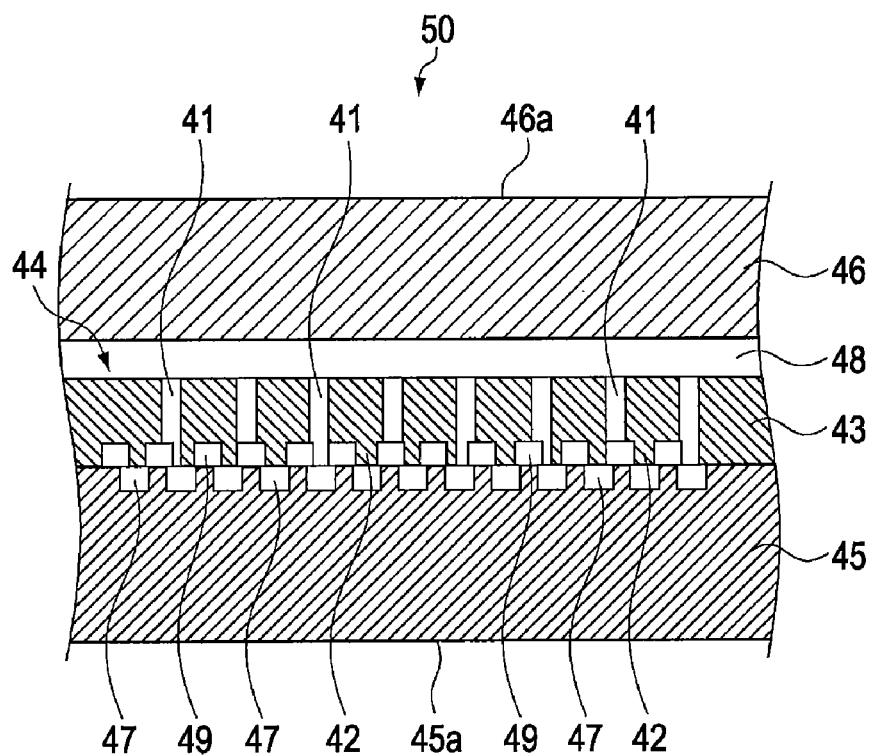
FIG. 19 is a sectional view of part of a heat transport device according to still another embodiment.
Figure 20:
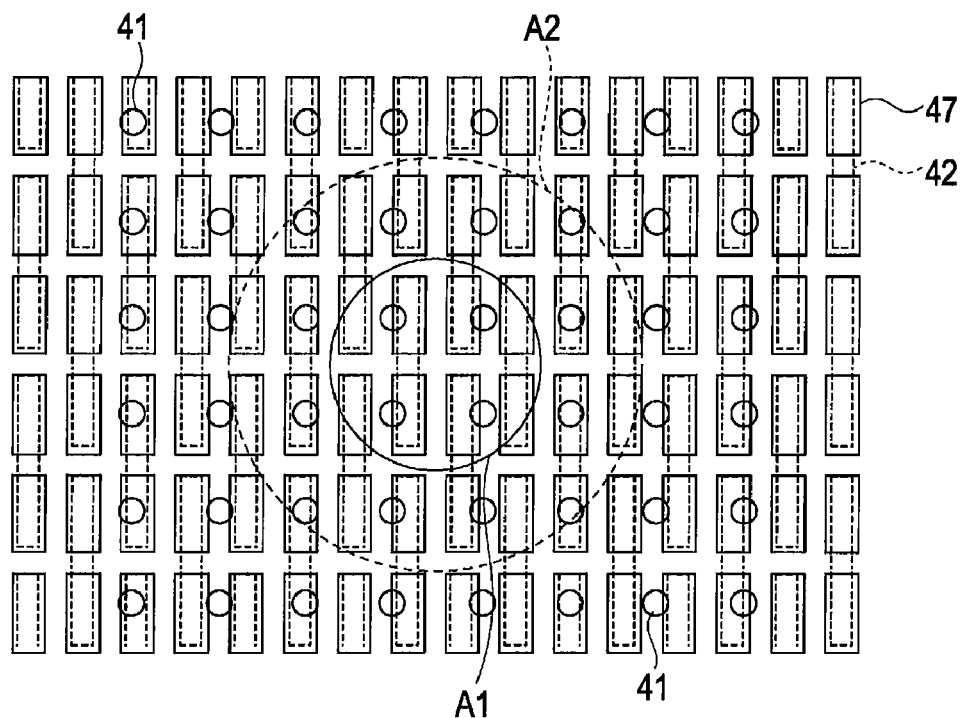
FIG. 20 is a plan view thereof.

FIG. 19 is a sectional view of part of a heat transport device according to still another embodiment; FIG. 20 is a plan view thereof. The heat transport device 50 includes a first plate 45 with a heat absorbing plane 45a, a second plate 46 with a heat emission plane 46a, and a third plate 43 arrange 4d between the first plate 45 and the second plate 46. On the respective bonding planes of the first plate 45 and the third plate 43, a plurality of recesses 47 and a plurality of projections 42 are formed. The configurations of the recesses 47 and the projections 42 may be similar to those of the recesses 37 and the projections 38 in the heat transport device 40 shown in FIGS. 11 to 14. The second plate 46 is provided with a concave region 48 formed on its bonding plane with that of the third plate 43. The configuration of the concave region 48 may be similar to that of the concave region 18 provided in the second plate 16 of the heat transport device 20 shown in FIGS. 7 and 8. Furthermore, the third plate 43 is provided with a plurality of communication paths 41 passing through from the first plate 45 into the second plate 46, thereby, communicating between the recesses 47 and the concave region 48 via the communication paths 41.

For example, the first plate 45 uses silicon and the second plate 46 and the third plate 43 use glass. When glass materials are bonded together in this case, if a metallic film is formed on any one of the bonding planes, the anode coupling can be done. The metallic film includes silver, copper, aluminum, tantalum, and other metallic materials. In addition, all the first to third plates 45, 46, and 43 may use a metal, or the first and third plates 45 and 43 may use a metal while the second plate 46 may use glass. Also, they are not limited to these materials so that appropriate materials may be selected.

A region marked by A1 in FIG. 20 represents a contact portion with the end portion 94b of the thermal point source 93 in the heat source device 100 used in the above-experiments, and the diameter of the region is about the diameter "q". A region A2 is a portion, where the working fluid is supposed to evaporate, and the diameter of the region is about the diameter "2q". The heat with 0.7 watts is supposed to enter these regions A1 and A2 from one thermal point sources 93 in the heat source device 100 when the first plate 45 of the heat transport device 50 uses silicon and the second and third plates 46 and 43 use glass.

In the heat transport device 50 having such flow paths 44, the working fluid evaporated mainly at the recesses 47 (or grooves 49 of the third plate 43 formed in the peripheries of the recesses 47 and the projections 42) flows into the concave region 48 via the communication paths 41 to be condensed by emitting heat. The condensed working fluid is returned due to the capillary force mainly to the recesses 47 (or the grooves 49 of the third plate 43 formed in the peripheries of the recesses 47 and the projections 42) via the communication paths 41. According to the embodiment, the third plate 43 has a heat insulating function, and since the volume of the working fluid is expanded in the concave region 48, the working fluid is liable to change in phase, improving the heat transporting efficiency.

Figure 21:
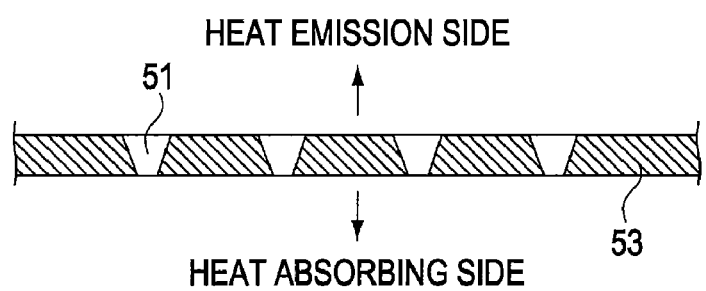
FIG. 21 is a sectional view of a modification of a communication path provided in a third plate.

FIG. 21 shows a modification of the communication path provided in the third plate. The communication paths 51 provided in the third plate 53 are tapered to gradually expand toward the heat emission plane from the heat absorbing plane. Thereby, the working fluid evaporated mainly at the recesses 47 is liable to expand toward the concave region 48. The communication paths 21 provided in the third plate 23 of the heat transport device 30 shown in FIGS. 9 and 10 may also be tapered as shown in FIG. 21.

Figure 22:
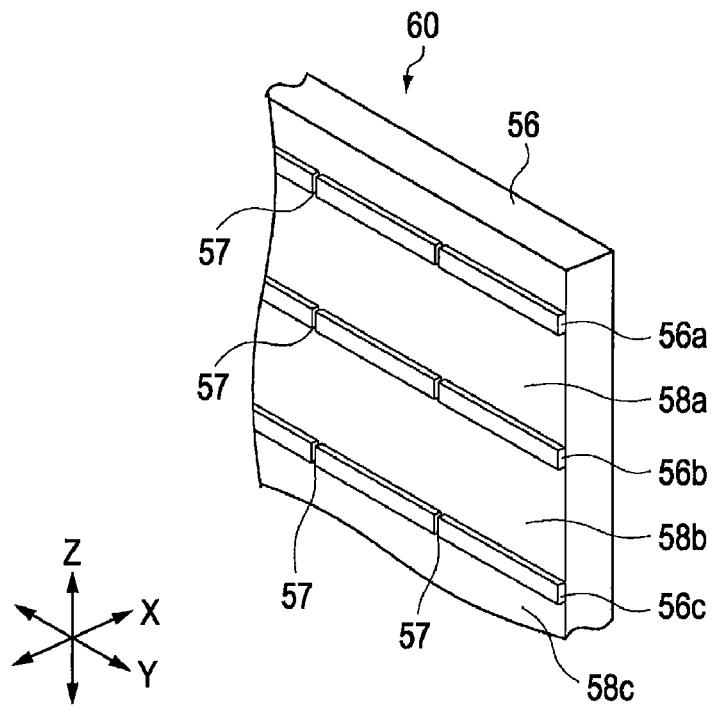
FIG. 22 is a perspective view of part of a plate on the heat emission side according to still another embodiment.

FIG. 22 is a perspective view of part of a plate on the heat emission side according to still another embodiment. According to this embodiment, a plate 56 adjacent to the heat emission is provided with a plurality of rectangular ribs 56a, 56b, 56c, . . . formed on its plane bonded with a plate (not shown) adjacent to the heat absorbing. That is, by providing the plurality of ribs 56a, 56b, 56c, . . . , the concave region is divided into a plurality of parts. According to the embodiment, the heat transport device 60 is effective when it is used in a vertical posture where the z direction is vertical. That is, the evaporated gaseous phase working fluid is assumed to also move upwardly; thus, the gaseous phase working fluid can be prevented from being upward deviated in the concave region, contributing to the uniform cooling. Each of the ribs 56a, 56b, 56c, . . . is provided with a slit 57 with a micro width formed for equalizing the pressures of the regions 58a, 58b, 58c . . . by making them communicate with each other.

Figure 23:
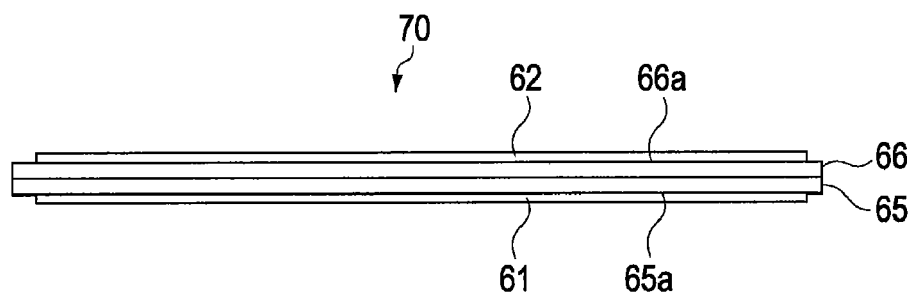
FIG. 23 is a side view of a heat transport device according to still another embodiment.

FIG. 23 is a side view of a heat transport device 70 according to still another embodiment. In the heat transport device 70, clad materials 61 and 62 are joined on a heat absorbing plane 65a of a first plate 65 and a heat emission plane 66a of a second plate 66, respectively. The thermal conductivity is improved due to the joined clad materials 61 and 62. The clad materials 61 and 62 are formed of copper and stainless steel, for example. When the clad material formed of copper and stainless steel is used, the first plate 65 and the second plate 66 are made of stainless; parts of the clad materials 61 and 62 to be contacted with the heat absorbing plane 65a and the heat emission plane 66a, respectively, are made of stainless steel; and outer parts thereof are copper. However, the materials of the clad materials 61 and 62 are not limited to these. In addition, the clad material may be used for any one of the heat absorbing plane 65a and the heat emission plane 66a.

The present application is not limited to the embodiments described above, so that various modifications can be made.

Referring to FIG. 9, the third plate 23 is provided for forming the communication paths 21; however, the first plate 25 may also be provided with the grooves 27 and the communication paths 21 formed thereon. Alternatively, the second plate 26 may also be provided with the grooves 28 and the communication paths 21 formed thereon.

For example, the heat transport devices 20 and 40 respectively shown in FIGS. 7 and 11 may be provided with a third plate having communication paths.

According to the embodiments described above, the display and the computer are exemplified as the electronic instrument; however, in addition to these, the electronic instrument includes a PDA (personal digital assistance), an electronic dictionary, a camera, an audiovisual instrument, a projector, a mobile phone, a gaming instrument, a car navigator, a robot, and other electronic appliances.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A plate-type heat transport device, comprising:
a first plate including a first bonding plane and a heat absorbing plane absorbing heat due to evaporation of a working fluid;
a second plate including a second bonding plane bonded to the first bonding plane and a heat emission plane opposing the heat absorbing plane and emitting heat due to condensation of the working fluid; and
a flow path two-dimensionally arranged between the heat absorbing plane and the heat emission plane to align with the heat absorbing plane and the heat emission plane, the flow path allowing the working fluid to flow therethrough for changing the phase of the working fluid, and the flow path being capable of two-dimensionally diffusing the working fluid by generating a capillary force in the condensed working fluid,
wherein the flow path includes a plurality of first regions arranged in the first bonding plane facing a plurality of second regions arranged in the second bonding plane, the first regions two-dimensionally arranged at a position adjacent to the heat absorbing plane, each being a straight shape arranged in parallel with each other, the plurality of second regions two-dimensionally arranged at a position adjacent to the heat emission plane to oppose the heat absorbing plane, each being a straight shape arranged in parallel with each other to be orthogonal to each of the first regions facing the second regions.

2. The plate-type heat transport device according to claim 1, wherein each of the first regions has a first width while each of the second regions has a second width larger than the first width.

3. An electronic instrument, comprising:
a heat source two-dimensionally generating heat; and
a plate-type heat transport device,
wherein the plate-type heat transport device includes:
a first plate including a first bonding plane and a heat absorbing plane thermally connected to the heat source and absorbing heat due to evaporation of a working fluid;
a second plate including a second bonding plane bonded to the first bonding plane and a heat emission plane opposing the heat absorbing plane and emitting heat due to condensation of the working fluid; and
a flow path two-dimensionally arranged between the heat absorbing plane and the heat emission plane to align with the heat absorbing plane and the heat emission plane, the flow path allowing the working fluid to flow therethrough for changing the phase of the working fluid, and the flow path being capable of two-dimensionally diffusing the working fluid by generating a capillary force in the condensed working fluid,
wherein the flow path includes a plurality of first regions arranged in the first bonding plane facing a plurality of second regions arranged in the second bonding plane, the first regions two-dimensionally arranged at a position adjacent to the heat absorbing plane, each being a straight shape arranged in parallel with each other, the plurality of second regions two-dimensionally arranged at a position adjacent to the heat emission plane to oppose the heat absorbing plane, each being a straight shape arranged in parallel with each other to be orthogonal to each of the first regions facing the second regions.

4. The instrument according to claim 3, wherein the heat source includes a display panel.

5. The plate-type heat transport device according to claim 1, wherein a width of each of the plurality of first regions and each of the plurality of second regions ranges from 10 μm to 200 μm.

6. The plate-type heat transport device according to claim 1, wherein a depth of each of the plurality of first regions and each of the plurality of second regions ranges from 10 μm to 20 μm.

7. The plate-type heat transport device according to claim 1, wherein the first bonding plane between the plurality of first regions is bonded to the second bonding plane between the plurality of second regions.

* * * * *